(12) United States Patent
Chen et al.

(10) Patent No.: US 8,047,271 B2
(45) Date of Patent: Nov. 1, 2011

(54) HEAT DISSIPATION DEVICE HAVING A FAN HOLDER

(75) Inventors: Chun-Chi Chen, Taipei Hsien (TW); Hong-Cheng Yang, Shenzhen (CN); He-Ping Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 984 days.

(21) Appl. No.: 11/961,357

(22) Filed: Dec. 20, 2007

(65) Prior Publication Data
US 2009/0159245 A1 Jun. 25, 2009

(51) Int. Cl.
*F24H 3/02* (2006.01)
*H01L 23/467* (2006.01)
(52) U.S. Cl. .......... 165/121; 165/80.3; 361/697
(58) Field of Classification Search .......... 165/121, 165/80.3; 361/697
See application file for complete search history.

(56) References Cited

U.S. PATENT DOCUMENTS

| | | | | |
|---|---|---|---|---|
| 6,304,445 B1 * | 10/2001 | Bollesen | | 361/697 |
| 6,466,440 B2 * | 10/2002 | Kaneko | | 361/690 |
| 6,520,250 B2 * | 2/2003 | Lee et al. | | 165/121 |
| 6,736,196 B2 * | 5/2004 | Lai et al. | | 165/122 |
| 7,369,408 B2 * | 5/2008 | Chang | | 361/697 |
| 7,443,676 B1 * | 10/2008 | Li | | 361/700 |
| 7,447,020 B2 * | 11/2008 | Xia et al. | | 361/695 |
| 2004/0194926 A1 * | 10/2004 | Lee et al. | | 165/80.3 |
| 2007/0058341 A1 * | 3/2007 | Hsiao | | 361/695 |
| 2007/0261822 A1 * | 11/2007 | Lin et al. | | 165/104.33 |
| 2007/0274038 A1 * | 11/2007 | Sun | | 361/695 |
| 2009/0166010 A1 * | 7/2009 | Chen et al. | | 165/121 |
| 2010/0302730 A1 * | 12/2010 | Hernon | | 361/694 |

* cited by examiner

*Primary Examiner* — Cheryl J Tyler
*Assistant Examiner* — Melanie Reuter
(74) *Attorney, Agent, or Firm* — Altis Law Group, Inc.

(57) ABSTRACT

A heat dissipation device includes a heat sink, a fan holder, and a fan secured on a front side of the fan holder. The heat sink includes a base and fins on the base. An engaging groove is defined in top ends of the fins. The fan holder includes a top panel and two sidewalls extending downwardly from two lateral edges of the top panel. The top panel has an inserting protrusion at a bottom surface thereof. The two sidewalls have two latching legs at lower ends thereof. The top panel is partially placed on a front portion of the top ends of the fins, and the inserting protrusion is inserted into the engaging groove of the fins. The two sidewalls abut against two lateral sides of the heat sink, and the two latching legs fasten to two lateral sides of the base of the heat sink.

17 Claims, 5 Drawing Sheets

HEAT DISSIPATION DEVICE HAVING A FAN HOLDER

BACKGROUND OF THE INVENTION

1. Field of the Invention

The present invention relates generally to a heat dissipation device, and more particularly to a heat dissipation device having a heat sink and a fan holder for facilitating a mount of a fan on the heat sink, wherein the fan holder also functions as a fan duct to guide an airflow flowing from the fan to electronic devices.

2. Description of Related Art

Generally, in order to ensure the normal running of an electronic device, a heat dissipation device is used to dissipate heat generated by the electronic device. A conventional heat dissipation device includes a heat sink and a fan attached on the heat sink to improve a heat-dissipation capacity of the heat sink.

When installing the fan to the heat sink, it is generally fixed the fan to a side of the heat sink via a fan holder with screws. Although using the screws can achieve the fastening objective, it requires a lot of manpower and material resource. Furthermore, it is necessary to remove the fan first by unscrewing the screws when disassembling and maintaining the heat dissipation device. Such unscrewing operation is tiresome for a user. In addition, it is also possible that the unscrewed screws may fall into a computer in which the heat dissipation device is mounted to cause damages to components of the computer.

What is needed, therefore, is a heat dissipation device having a design which makes assembling and disassembling of a fan to/from a heat sink of the heat dissipation device convenient and easy.

SUMMARY OF THE INVENTION

The present invention relates to a heat dissipation device for dissipating heat from a heat-generating electronic element. The heat dissipation device includes a heat sink, a fan holder and a fan secured on a front side of the fan holder. The heat sink comprises a base and a plurality of fins on the base. An engaging groove is defined in top ends of the fins. The fan holder comprises a top panel and two sidewalls extending downwardly from two lateral edges of the top panel. The top panel has an inserting protrusion at a bottom surface thereof. The two sidewalls have two latching legs at lower ends thereof. The top panel is partially placed on front portion of the top ends of the fins and the inserting protrusion is inserted into the engaging groove of the fins, the two sidewalls abut against two lateral sides of the heat sink and the two latching legs fasten to two lateral sides of the base of the heat sink. The fan is easily assembled to the heat sink via the fan holder, because either installation of the fan to the fan holder or the fan holder to the heat sink do not require any screws and relative tool, and can be simply completed by operations of proper placement and pushing via locking structure which is provided by the fan holder.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

FIGS. 1 to 5 illustrate a heat dissipation device in accordance with a preferred embodiment of the present invention. The heat dissipation device is adapted for removing heat from a heat-generating component such as CPU (not shown). The heat dissipation device comprises a heat sink 10, a fan holder 20 and a fan 30 mounted on a front side of the heat sink 10 via the fan holder 20.

Figure 1:
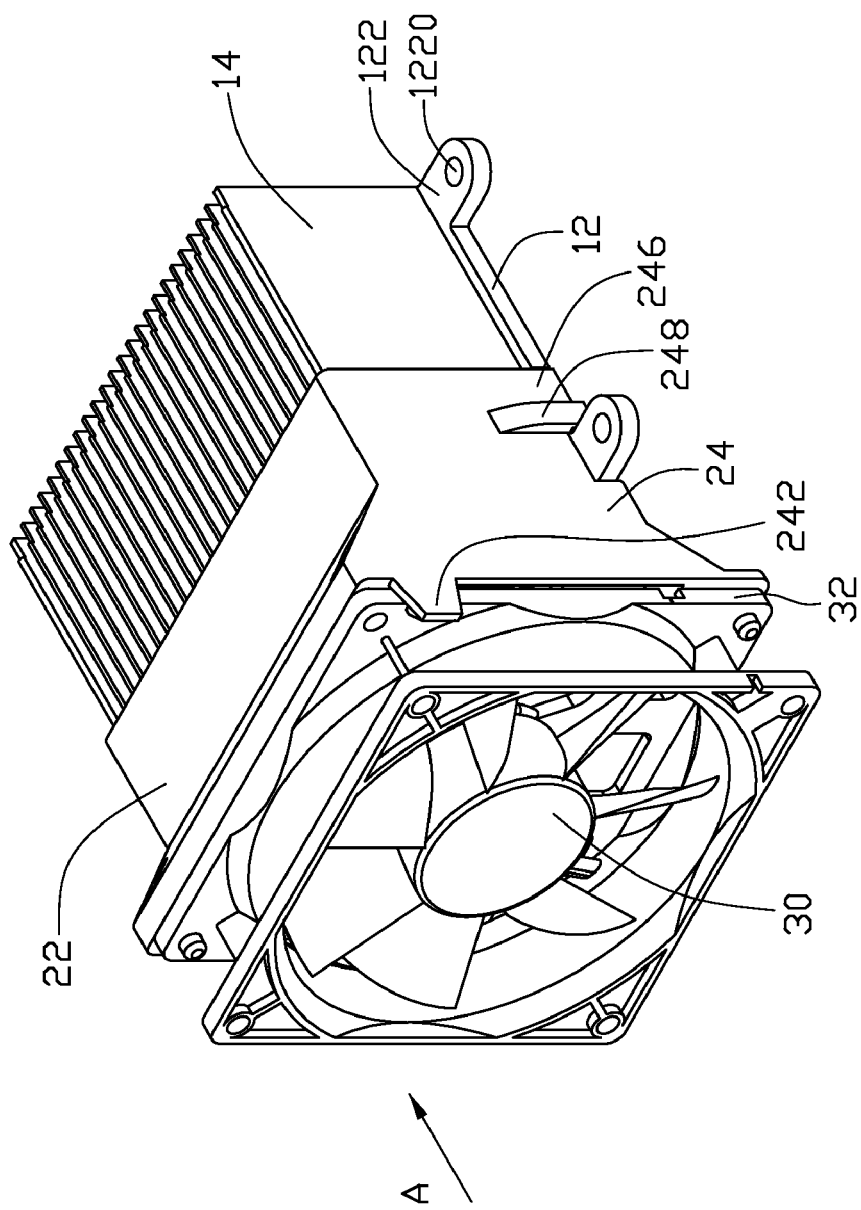
FIG. 1 is an assembled view of a heat dissipation device in accordance with a preferred embodiment of the present invention.
Figure 2:
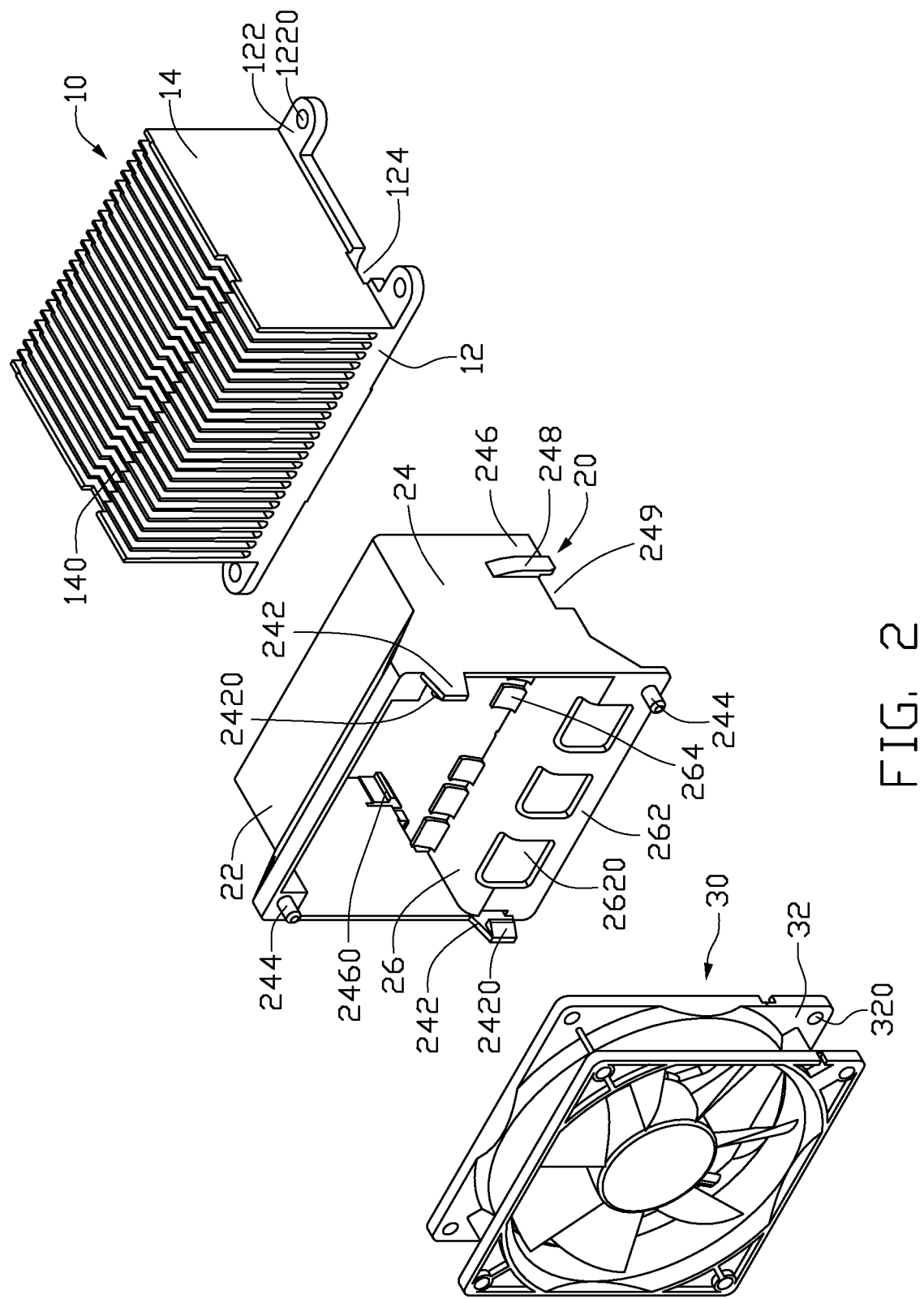
FIG. 2 is an exploded, isometric view of FIG. 1.

Referring to FIG. 1, the direction arrow "A" is located at a "front side" of the heat dissipation device. In the description that follows, the stated orientations of all of the elements of the heat dissipation device accord with the orientations of all of the elements of FIG. 1.

The heat sink 10 is formed of a material having a good heat conductivity such as aluminum and copper, comprises a heat receiver such as a rectangular base 12 and a plurality of fins 14 extending upwardly from a top surface of the base 12. Particularly shown in FIGS. 4 and 5, the base 12 has protruding portion 120 extending downwardly from a middle of a bottom surface thereof, for contacting with the CPU. A front end of the protruding portion 120 is triangular with a tip thereof pointing to the fan 30 for guiding an airflow generated by the fan 30 to electronic components (not shown) located to two lateral sides of the CPU. The base 12 has four fixing ears 122 extending laterally from two opposite lateral sides thereof. Each of the fixing ears 122 is located adjacent to one of corners of the base 12 and defines a retaining hole 1220 therein for receiving a fixture to secure the heat sink 10 onto the CPU. Two locking cutouts 124 are defined at two lateral sides of the base 12 and are respectively located adjacent to two front ones of the fixing ears 122. The fins 14 are substantially rectangular thin flakes, spaced from each other and perpendicular to the top surface and a front side of the base 12. Top ends of the fins 14 are coplanar and form an elongated engaging groove 140 therein. The engaging groove 140 spans over the two lateral sides of the heat sink 10, is perpendicular to the fins 14 and situated closely to the front side of fins 14.

The fan holder 20 can be integrally formed of plastic and comprises a top panel 22, two sidewalls 24 extending downwardly from two lateral edges of the top panel 22 and a bottom board 26 connecting front parts of bottom edges of the sidewalls 24. Fronts sides of the top panel 22, sidewalls 24 and the bottom board 26 are coplanar and cooperatively define a fixing interface (not labeled) for mounting the fan 30 thereon. A front portion of the top panel 22 is oblique upwardly to reach an upper edge of the fan 30. The top panel 22 has an inserting protrusion 220 (shown in FIG. 5) extending downwardly from a bottom surface thereof. The inserting protrusion 220 is elongated, situated adjoining to a front edge of the top [panel 22 and configured to insert into the engaging groove 140 for positioning the fan holder 20 to the heat sink 10. The two sidewalls 24 are perpendicular to the top panel 22 and cover front parts of the two lateral sides of the heat sink 10. A right one of the sidewalls 24 has a latching arm 242 extending forward from the upper front side thereof and adjacent to the top panel 22. A left one of the sidewalls 24 also has a latching arm 242 extending forward from the lower front side thereof and adjacent to the bottom board 26. The two latching arms 242 are substantially catercornered on the fixing interface of the fan holder 20 and have two hooks 2420 formed respectively at two distal ends thereof. The two hooks 2420 of the two latching arms 242 face inwardly and are configured to diagonally catch two lateral sides of the fan 30. A pair of restricting posts 244 extend forward from other two catercornered positions of the mounting interface of the fan holder 20 for inserting into the fan 30 to hold the fan 30 in position.

The two sidewalls 24 have two latching legs 246 (clearly shown in FIG. 5) at two corners thereof that are adjacent to lower ends and rear sides thereof. The two latching legs 246 have two hooks 2460 extending inwardly from two distal ends thereof. The two hooks 2460 of the latching legs 246 face each other and fasten to a bottom of the base 12 of the heat sink 10 when received in the locking cutouts 124 in two lateral sides of the base 12. The two latching legs 246 are partially separated from the sidewalls 24 by two vertical slots (not labeled) at front sides thereof and therefore are enabled to deform elastically. Two protruding blocks 248 are outwardly protruded from the two sidewalls 24 along the slots to reinforce edges of the sidewalls 24 corresponding to the slots. Two rectangular gaps 249 are formed in bottom ends of the sidewalls 24 and adjoining to the blocks 248 for received the two front ones of the fixing ears 122 of the heat sink 10.

Figure 3:
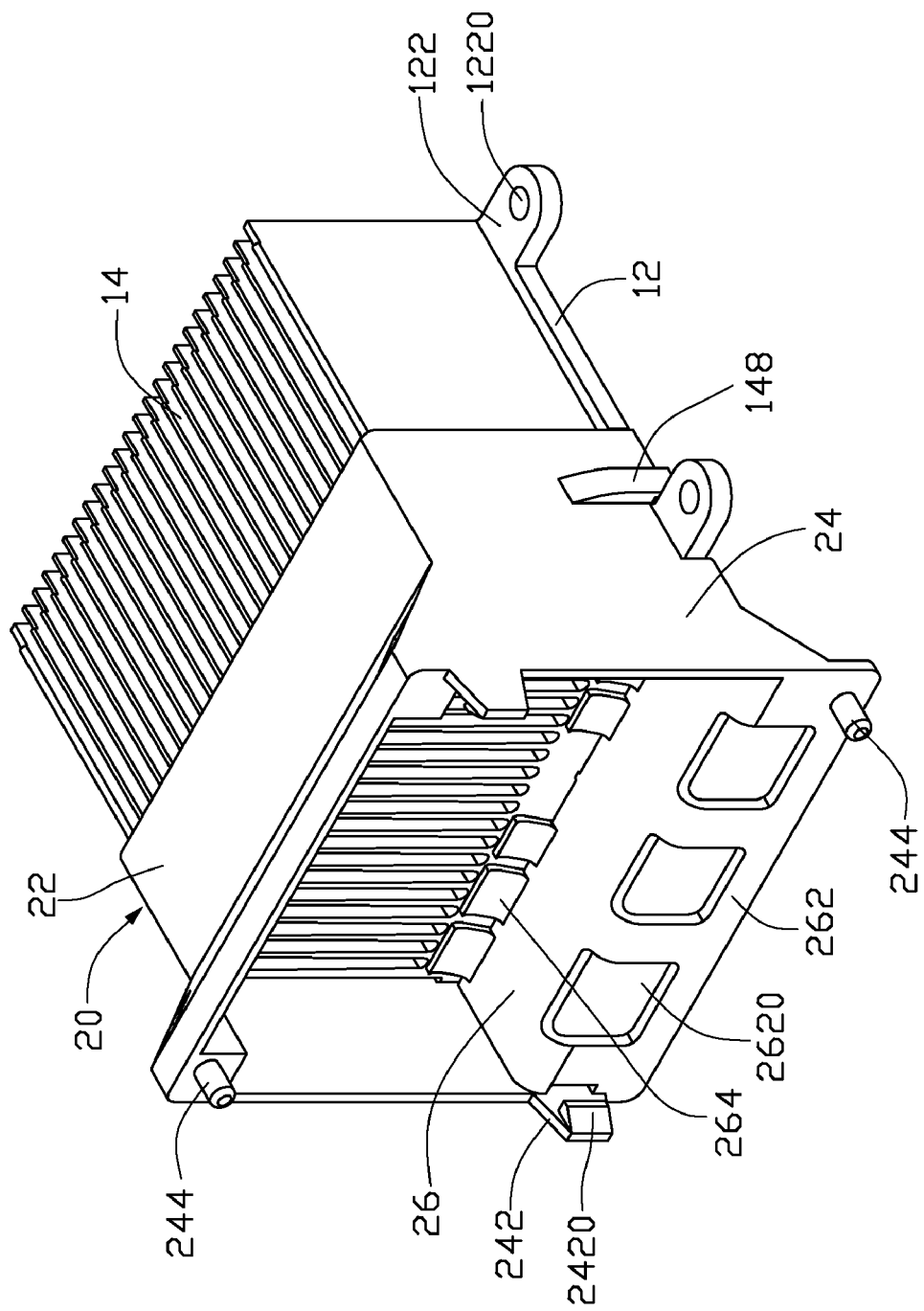
FIG. 3 is an assemble view of a heat sink and a fan holder of the heat dissipation device in FIG. 2.
Figure 4:
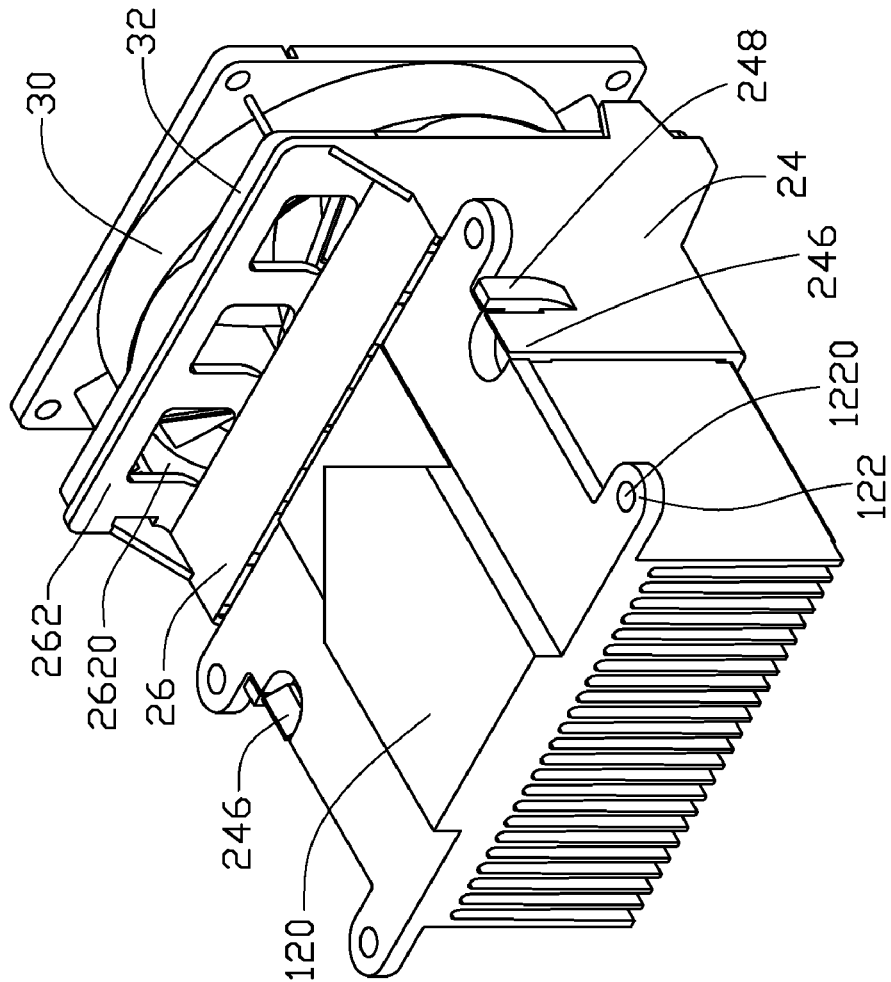
FIG. 4 is a reverse view of the heat dissipation device in FIG. 1.
Figure 5:
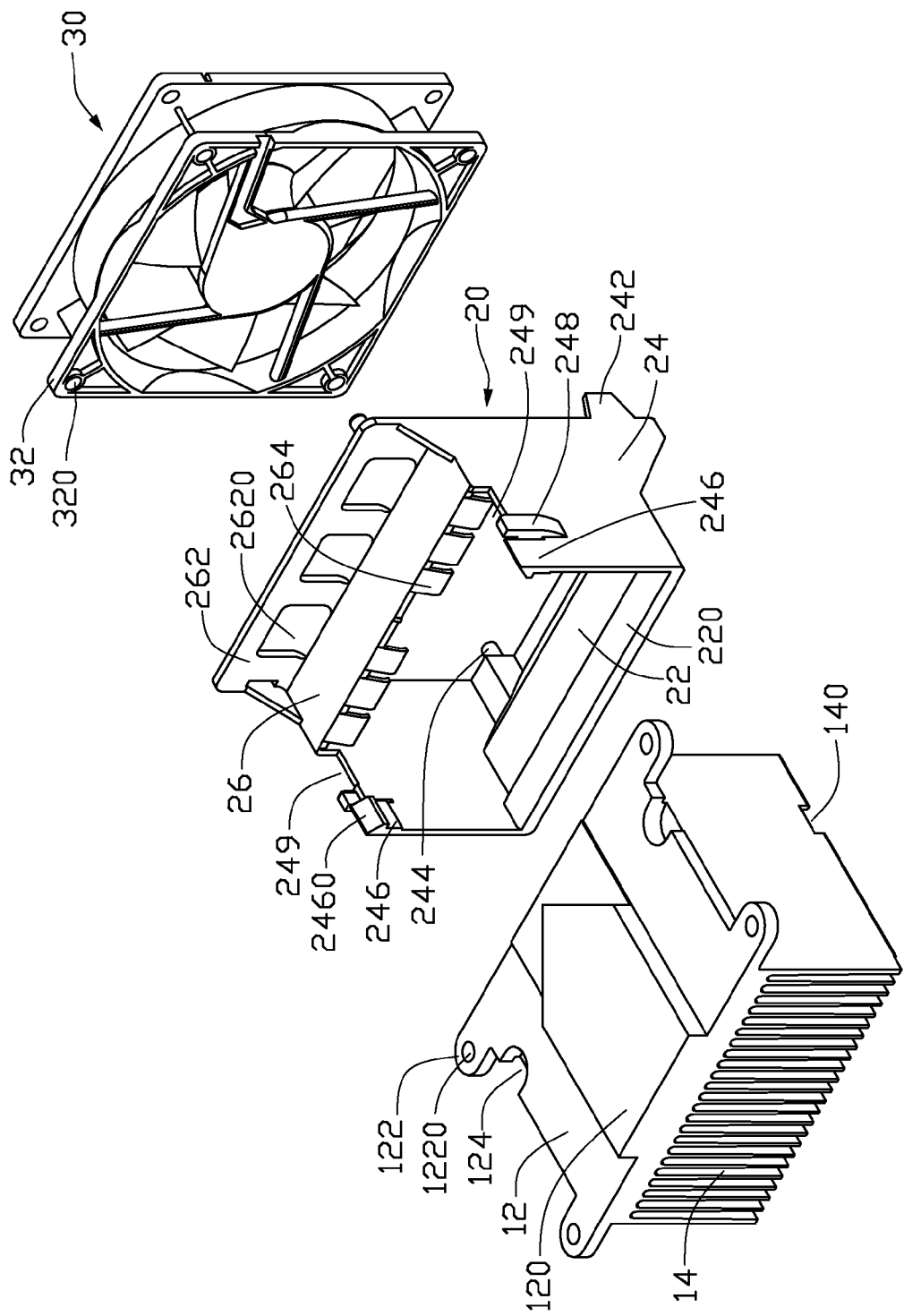
FIG. 5 is an exploded, isometric view of FIG. 4.

The bottom board 26 is parallel to the top panel 22, and located closely in front of the gaps 249. The bottom board 26 has an air-guiding plate 262 extending downwardly from a front side thereof. The air-guiding plate 262 faces the fan 30 and defines a plurality of through holes 2620 therein. The through holes 2620 are located beneath the base 12 of the heat sink 10, whereby airflow blowing from the fan 30 can pass through the through holes 2620 to reach the triangular front end of the protruding portion 120 of the base 12. A plurality of tabs 264 projects upwardly from a rear edge of the bottom board 26 and abuts against the front side of the base 12 of the heat sink 10 to keep the fan holder 20 in position (as shown in FIG. 3).

The fan 30 has a rectangular frame (not labeled) having a size consistent with that of the fixing interface of the fan holder 20. The frame has two separated fixing flanges 32 at each corner thereof. Each of the flanges 32 defines a fixing hole 320 therein for received the restricting post 244 of the fan holder 20.

In assembly of the heat dissipation device, the inserting protrusion 220 of the top panel 22 of the fan holder 20 is inserted into the engaging groove 140 in the top of the heat sink 10. The tabs 264 abut against the front side of the base 12 of the heat sink 10. The two sidewalls 24 of the fan holder 20 abut against the front part of the two lateral sides of the heat sink 10 and the two hooks 2460 of the two latching legs 246 of the sidewalls 24 are locked in the locking cutouts 124 in the bottom of the heat sink 10, thus the fan holder 20 is securely locked in the front side of the heat sink 10. The restricting posts 244 are received in two fixing holes 320 of two diagonal fixing flanges 32 of the fan 20 and the two hooks 2420 of the latching arms 242 of the fan holder 20 fasten to another two diagonal fixing flanges 32 of the fan 30, thus the fan 30 is securely assembled to the fan holder 20.

According to aforementioned description, the fan 30 is easily assembled to the heat sink 10 via the fan holder 20, because either installation of the fan 30 to the fan holder 20 or the fan holder 20 to the heat sink 10 do not require any screws and tools, and can be simply completed by operations of proper placement and pushing via a locking structure which is provided by the fan holder 20. The fan holder 20 also works as a fan duct and encloses space between the fan 30 and the heat sink 10 to force as more as possible of the airflow generated by the fan 30 to pass through the heat sink 10.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention

What is claimed is:

1. A heat dissipation device adapted for dissipating heat from a heat-generating electronic element, the heat dissipation device comprising:
   a heat sink comprising a base and a plurality of fins extending upwardly from the base, an engaging groove being defined in top ends of the fins;
   a fan holder comprising a top panel, two sidewalls extending downwardly from two lateral edges of the top panel, and a bottom board connecting to front portions of the lower ends of the sidewalls, the top panel having an inserting protrusion extending downwardly from a bottom surface thereof, the two sidewalls being perpendicular to the top panel and having two latching legs at lower ends thereof, the bottom board being parallel to the top panel and having an air-guiding plate extending downwardly from a front side thereof, and the air-guiding plate defining a plurality of through holes that are located beneath the base of the heat sink; and
   a fan secured at a front side of the fan holder;
   wherein the top panel is partially placed on a front portion of the top ends of the fins and the inserting protrusion is inserted into the engaging groove of the fins, the two sidewalls abut against front portions of two lateral sides of the heat sink, and the two latching legs fasten to two lateral sides of the base of the heat sink.

2. The heat dissipation device of claim 1, wherein the two latching legs face each other and have two hooks extending inwardly from distal ends thereof, the base of the heat sink defines two latching cutouts at two lateral sides thereof, and the two latching cutouts engagingly receive the two hooks, respectively.

3. The heat dissipation device of claim 2, wherein the latching legs are adjacent to rear sides of the sidewalls and are partially separated from the sidewalls by two vertical slots in two respective sidewalls.

4. The heat dissipation device of claim 3, wherein the base has four fixing ears extending outwardly from the two lateral sides thereof and being respectively adjacent to four corners thereof, and two gaps are defined in the lower ends of the two sidewalls and receive two front ones of the fixing ears.

5. The heat dissipation device of claim 1, wherein a front portion of the top panel is slanted obliquely upwardly, and the inserting protrusion is elongated and adjacent to and extends along a rear side of the top panel.

6. The heat dissipation device of claim 1, wherein the base has a protruding portion extending downwardly from a middle of a bottom surface thereof, and a front end of the protruding portion is triangular with a tip thereof pointing to the through holes.

7. The heat dissipation device of claim 1, wherein a restricting post extends forward from a joint between a left one of the sidewalls and the top panel, and another restricting post extends forward from a joint between a right one of the sidewalls and the bottom board.

8. The heat dissipation device of claim 7, wherein a latching arm extends forward from a front side of the right one of the sidewalls and is adjacent to the top panel, and another latching arm extends forward from a front side of the left one of the sidewalls and is adjacent to the bottom board.

9. The heat dissipation device of claim 8, wherein two hooks extend inwardly from distal ends of the latching arms and catch two lateral sides of the fan, and the two restricting posts are inserted into two diagonal corners of the fan.

10. The heat dissipation device of claim 1, wherein the fins are spaced from each other and perpendicular to a top surface and a front side of the base.

11. A heat dissipation device comprising:
a heat sink comprising a base and a plurality of fins extending upwardly from the base, an engaging groove defined in top ends of the fins;
a fan holder comprising a top panel, two sidewalls extending downwardly from two lateral edges of the top panel, and a bottom board connecting to front portions of the lower ends of the sidewalls, the top panel having an inserting protrusion extending downwardly from a bottom surface thereof, the two sidewalls having two latching legs at lower ends thereof, a restricting post extending forward from an end of either of the sidewalls, two latching arms extending forward from front sides the sidewalls, the bottom board having an air-guiding plate extending downwardly from a front side thereof, and the air-guiding plate therein defining a plurality of through holes that are located beneath the base of the heat sink; and
a fan secured at a front side of the fan holder;
wherein the top panel is partially placed on front portion of the top ends of the fins and the inserting protrusion is inserted into the engaging groove of the fins, the two sidewalls abut against front portions of two lateral sides of the heat sink and the two latching legs fasten to two lateral sides of the base of the heat sink, the restricting post is inserted into one of corners of the fan, and the two latching arms fasten to two lateral sides of the fan.

12. The heat dissipation device of claim 11, wherein the two latching legs face each other and have two hooks extending inwardly from distal ends thereof, the base of the heat sink defines two latching cutouts at two lateral sides thereof, and the two latching cutouts engagingly receive the two hooks, respectively.

13. A heat dissipation device, comprising:
a heat sink comprising a base and a plurality of fins extending upwardly from the base, the base defining a pair of first cutouts at two opposite ends thereof, each of the fins defining a second cutout at a top end thereof, and the second cutouts of the fins forming a continuous groove;
a fan holder comprising a top panel, two sidewalls extending downwardly from two lateral ends of the top panel, and a bottom panel opposite to the top panel and extending from bottom ends of the sidewalls; the top panel, the sidewalls and the bottom panel cooperatively forming a mounting interface at front sides thereof, a locking device formed at the mounting interface, the top panel forming an elongated protrusion engaged in the groove of the fins of the heat sink, the sidewalls forming a pair of latches at the bottom ends thereof to be engaged in the first cutouts of the base of the heat sink, the bottom panel having an air-guiding plate extending downwardly from a front side thereof, and the air-guiding plate therein defining a plurality of through holes that are located beneath the base of the heat sink; and
a fan mounted on the mounting interface of the fan holder via the locking device.

14. The heat dissipation device of claim 13, wherein the locking device comprises a pair of protruding poles forming at two diagonal corners of the mounting interface of the fan holder and snugly engaged in corresponding corners of the fan, and a pair of clasps formed at the other two diagonal corners of the mounting interface of the fan holder and snugly grasping corresponding corners of the fan.

15. The heat dissipation device of claim 13, wherein the top panel, the sidewalls and the bottom panel cooperatively define an opening facing toward the fins for providing passage of an airflow generated by the fan.

16. The heat dissipation device of claim 13, wherein a baffle plate slantwise extends from a bottom end of the top panel toward the fan in a manner such that a top of the fan is located above the top of the fins of the heat sink, and a bottom of the bottom panel is located below the base of the heat sink in a manner such that a bottom of the fan is located below a bottom of the base of the heat sink.

17. The heat dissipation device of claim 13, wherein a plurality of tabs extends upwardly from an end of the bottom panel and abuts against the base of the heat sink, and a plurality of apertures is defined in the bottom panel, the apertures facing toward the fan.

* * * * *